United States Patent [19]
Bar-Cohen

[11] Patent Number: 4,698,541
[45] Date of Patent: Oct. 6, 1987

[54] BROAD BAND ACOUSTIC TRANSDUCER

[75] Inventor: Yoseph Bar-Cohen, Seal Beach, Calif.

[73] Assignee: McDonnell Douglas Corporation, Long Beach, Calif.

[21] Appl. No.: 755,009

[22] Filed: Jul. 15, 1985

[51] Int. Cl.[4] .......... H01L 41/08
[52] U.S. Cl. .......... 310/326; 310/327; 367/152; 367/162
[58] Field of Search .......... 310/326, 327; 367/152, 367/162; 73/632, DIG. 4

[56] References Cited

U.S. PATENT DOCUMENTS

| | | | |
|---|---|---|---|
| 2,430,013 | 11/1947 | Hansell | 367/152 |
| 2,754,925 | 7/1956 | Burke | 367/152 X |
| 2,922,483 | 1/1960 | Harris | 367/152 X |
| 3,383,631 | 5/1968 | Korpel | 367/152 X |
| 4,333,028 | 6/1982 | Panton | 310/326 |
| 4,366,406 | 12/1982 | Smith et al. | 73/632 X |
| 4,383,194 | 5/1983 | Ohigashi et al. | 310/327 X |
| 4,446,395 | 5/1984 | Hadjicostis | 310/327 |
| 4,482,835 | 11/1984 | Bar-Cohen et al. | 310/327 |
| 4,528,652 | 7/1985 | Horner et al. | 310/327 X |

OTHER PUBLICATIONS

Y. Bar-Cohen et al., "Multiphase Backing Materials for Piezoelectric Broadband Transducers", Acoustical Society of America, May 1984, pp. 1629–1633.

Swartz et al., "An Improved Wedge-Type Backing for Piezoelectric Transducers", IEEE Transactions of Sonics and Ultrasonics, vol. SU-26, No. 2, Mar. 1979, pp. 140-142.

Persson et al., "Acoustic Impedance Matching of Medical Ultrasound Transducers", Ultrasonics, Mar. 1985, pp. 83-89.

DeJong et al., "Vibration Modes, Matching Layers and Grating Lobes", Ultrasonics, Jul. 1985, pp. 176-182.

*Primary Examiner*—Patrick R. Salce
*Assistant Examiner*—Emanuel Todd Voeltz
*Attorney, Agent, or Firm*—Benjamin Hudson, Jr.; George W. Finch; John P. Scholl

[57] ABSTRACT

There is provided by this invention a broad band acoustic transducer comprising a piezoelectric crystal with a two layer dampening backing having very high attenuation properties. Each layer has an impedance matching the acoustical impedance of the crystal, however, the second layer has an attenuating additive that greatly increases its attenuation factor. The surface interface between the two dampening layers is tilted and roughened to induce wave scattering that prevents back reflections.

7 Claims, 6 Drawing Figures

BROAD BAND ACOUSTIC TRANSDUCER

This invention relates generally to acoustic transducers and more particularly to acoustic transducers having matching impedance dampers with high attenuation factors.

DESCRIPTION OF THE PRIOR ART

In applications such as depth resolution or defect characterization, a need exists for acoustic pulses of very short duration. To reduce the pulse duration, a backing material having an impedance closely matched to the crystal should be used. For practical purposes, in obtaining a transducer of small size, the backing material must have a very high attentuation to eliminate back reflection. As a common practice, two-phase mixtures consisting of a matrix and a powder filler are used. The matrix generally has a high absorption coefficient, and the filler induces strong scattering; this combination provides the required high attentuation. The proper selection of materials and volume fractions allows matching of the backing material and crystal impedances.

Tungsten-epoxy is the most widely used backing for commercial transducers due to its potential for providing a wide range of impedance values between $3\times10^5$ and $100\times10^5$ g/(cm$^2$ sec) and its sufficiently high attentuation. Most recently a high impedance alloy matrix was introduced that allows dampers to be made reproducible which have acoustical impedances in the range of 20–$45\times10^5$ g/(cm$^2$ sec). This allow matrix uses a combination of tungsten, copper, and indium-lead alloy as an optimal transducer backing. See "Multiphase Backing Materials For Piezoelectric Broadband Transducers," by Y. Bar-Cohen, et al Acoustical Society of America, May 1984. This transducer has an advantage over previously commercial transducers having a mixture of epoxy and tungsten prepared in two stages; requiring curing the epoxy, and gluing the damper to the crystal. The indium lead alloy provided a backing that can be produced in a single stage directly on the transducer because of the excellent solderability of the indium and lead to the gold plating. However, the transducer backing has relatively low attenuation making it undesirable in some applications.

It would be desirable if there were provided an acoustic transducer having a backing that can be reliably reproduced in mass manufacturing methods having both matched impedance with the crystal and high attenuation.

SUMMARY OF THE INVENTION

There is provided by this invention an acoustic transducer having a two-layer backing each having the same impedance, but the second backing has an attenuating additive. To assure minimal reflectivity from the layer's interface and from the end of the backing, the interface between the layers has been roughened and tilted at an angle to induce scattering.

BRIEF DESCRIPTION OF THE PREFERRED EMBODIMENT

Figure 1:
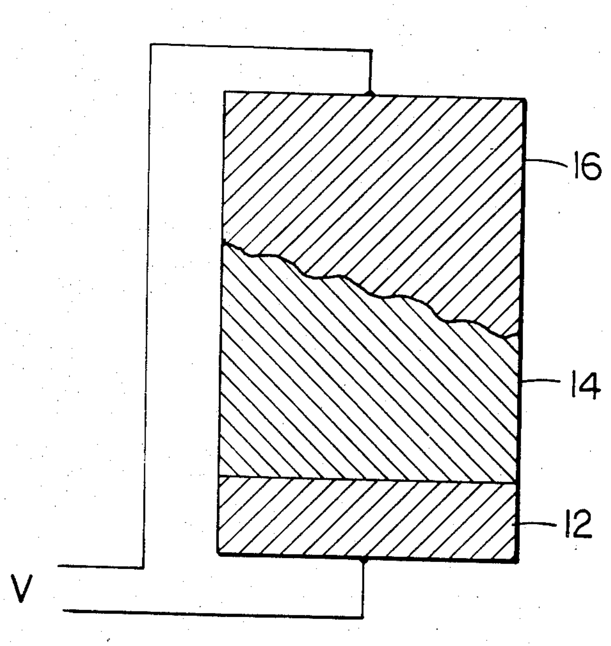
FIG. 1 is a schematical representation of the transducer composition incorporating the principles of this invention.
Figure 2:
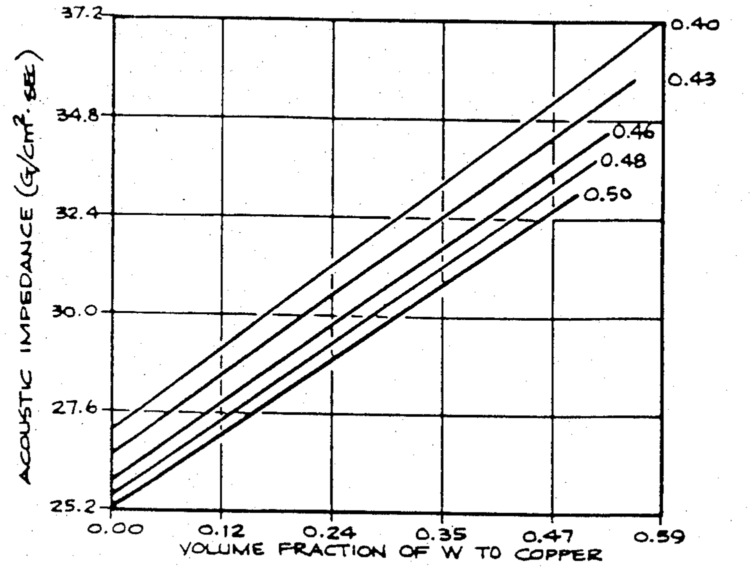
FIG. 2 illustrates acoustic impedance of the transducer as a function of volume fraction of Cu/W/In50-Pb50.
Figure 3:
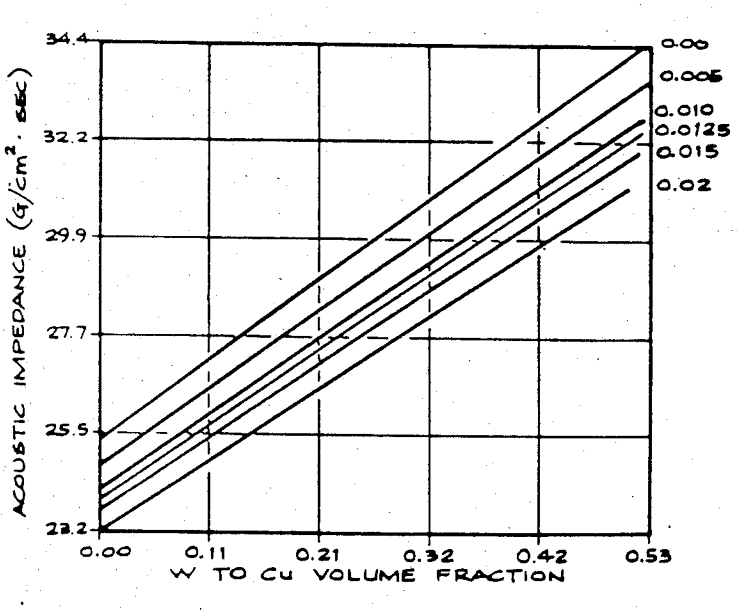
FIG. 3 illustrates acoustic impedance of the transducer as a function of volume fraction of W/Cu/diallyl phthalate/In50-Pb50.

Referring to FIG. 1, there is shown a schematical representation of a transducer composite 10. The transducer is generally comprised of a piezoelectric crystal 12 gold plated on both sides for electrodes. The crystal may be a PZT-5A having an acoustic impedance equal to $31.7\times10^5$ g/cm$^2$ sec. A first backing layer 14 having excellent solderability to the gold plating is generally comprised of a tungsten, copper, indium 50-lead 50 alloy. The second backing layer 16 having high attenuation properties is generally comprised of a tungsten, copper, indium 50-lead 50, and diallyl-phthalate alloy. The attenuation factor of the second backing layer 16 ia approximately 50 decibels per centimeter. This composite produces a transducer backing having an optimum impedance range of $28\times10^5$ to $34\times10^5$ g/cm$^2$ sec. Plot of the acoustic impedance as a function of volume fraction of the various constituents for each of the layers are shown in FIGS. 2 and 3. These plots should be read such that the x-axis represents the variation of volume fraction (VF) of the two major constituents. The total range of this axis ($X_{max}$) covers the sum of the VFs of these two constituents. For example, in FIG. 2 the value of VF=0.0 represents 0.0 w and 0.59 cu.

To determine the VF's that produces a given impedance z value, one needs to move parallel to the x-axis from the proper z value and stop at the graph of the third constituent that is elected to be used. The VF values Fi (where i=1 to 4 ) of each of the constituents is given as follows:

(1) F1 is read directly from the x-axis (2) F2 is equal to $X_{max}-$F1

(3) F3 is the value on the right hand side of the relevant graph.

(4)) F4 (applicable for the second layer) is specified in the figure caption for FIG. 3.

To tailor multi-constituent powder mixtures to the required acoustic impedance, a modification of the lower bounds of elastic properties to determine the acoustic impedance Z is found from the formula.

$$Z = E\zeta\left[\frac{2-\frac{E}{2\mu}}{\left(\frac{E}{2\mu}\right)\left(3-\frac{E}{\mu}\right)}\right]^{\frac{1}{2}}$$

where:

Z=effective (multi-constituent's) acoustic impedance.

E=effective elastic module.

$\zeta$=effective density.

$\mu$=effective shear module.

Using the technique, described previously, of choosing the proper VF for a given impedance, two mixtures were prepared. The constituent's actual weight for a given layer mixture was determined from the desired end product, namely, one half inch diameter and 0.5 inch height. To obtain a homogeneous mixture, the powders for each layer mixed were an off-axis v-shaped mixer that prevented particles from being in a steady state position at any time during the mixer rotation. The mixer rotation was controlled at a spin of 20 rpm for 15 minutes.

Once the powders were mixed, they were poured into a jig that is linked to a vacuum unit and a thermocouple. The first layer was roughened and tilted to an angle of approximately 25° before pouring the second layer.

Under vacuum, the two mixtures were pressed on a PZT-5A ½inch 5 MHz crystal at 500 psi and the temperature was raised to 210° F. The temperature was kept constant and the pressure was increased to 48 ksi. To maintain a constant temperature, an insulation blanket of fiberglass was wrapped around the jig during this process. Once the pressure had been reached, the fiberglass blanket was removed to increase the cooling rate of the jig.

Figure 4:
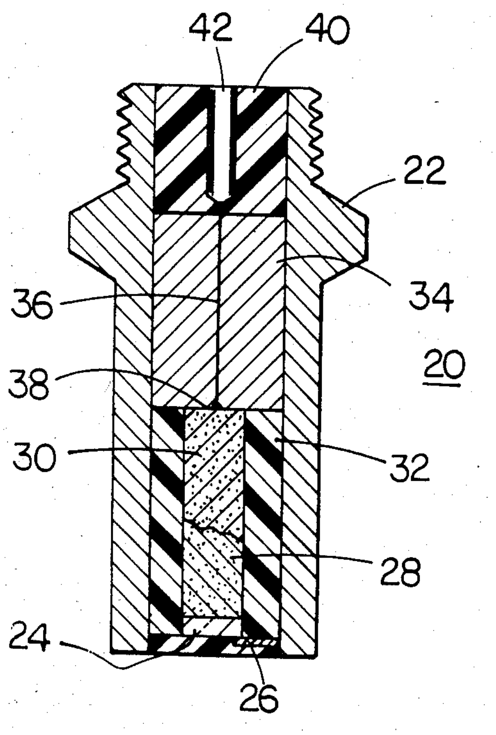
FIG. 4 is an illustration of a transducer assembly incorporating the principles of this invention.

The transducer assembly 20 is shown in FIG. 4 is generally comprised of a housing 22 having contained therein a piezoelectric crystal 24 mounted upon a ground connector 26 between the front electrode of the crystal and the housing 22. Mounted upon the crystal 24 is the backing material having a first layer 28 and a second layer 30 within a fiberglass sleeve 32. An epoxy-tungsten potting material 34 fills the upper portion of the housing 22. A connector 36 extends through the potting material to the back electrode 38.

An insulating insert 40 seals the top of the housing 22 having an aperture 42 extending to the connector 36 to facilitate external connection to the electrode 38.

Figure 5:
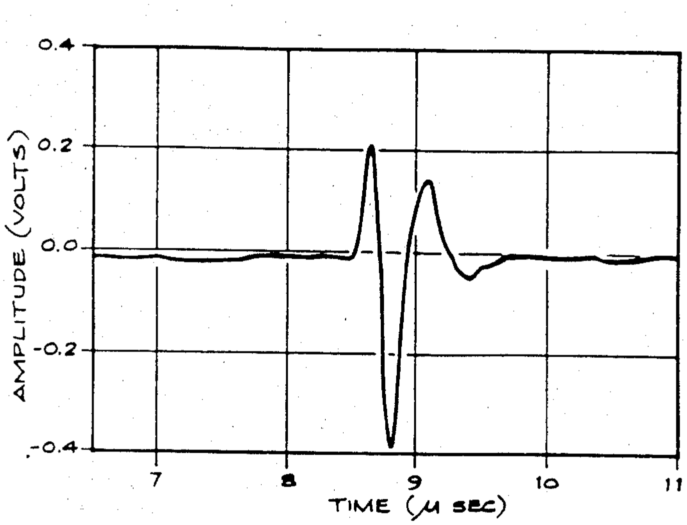
FIG. 5 illustrates the time domain description of a signal obtained from a transducer composite using a one half inch 5 MHz PZT-5A piezoelectric crystal.
Figure 6:
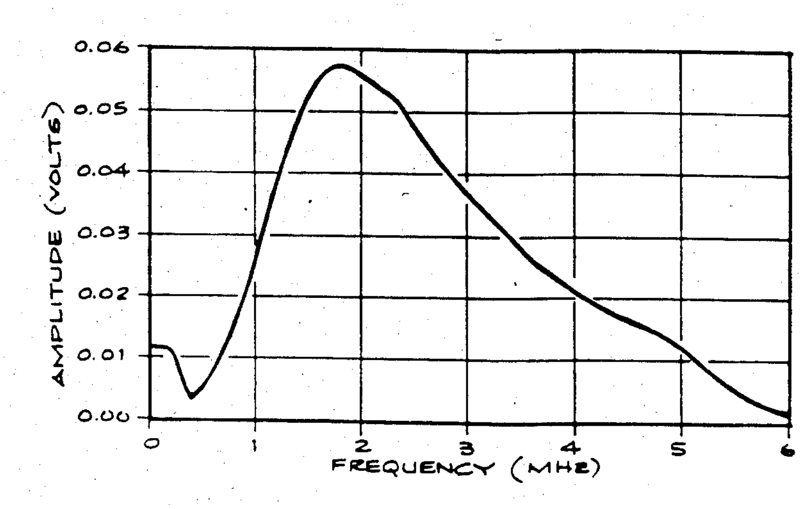
FIG. 6 illustrates the frequency domain description of the signal shown in FIG. 5.

Referring to FIGS. 5 and 6, the performance of the transducer core has been tested by exciting it with a panametric PR 5052 pulser/receiver and measuring the reflection from the back of the ½" steel plate. As can be seen in FIG. 6, the resultant transducer has a $q=f/\Delta f=0.64$ with a 1.8 MHz central frequency which represents a relatively high broadband characteristic. Testing has demonstrated that the backing impedance is highly reproducible and has a variation of ±8.8%. Compared to the more than 75% variation that is encountered in existing commercial production techniques. The production technique can be applied automatically for high manufacturing rates.

Although there has been illustrated and described specific detail and structure of operation, it is clearly understood that the same were merely for purposes of illustration and that changes and modifications may be readily made therein by those skilled in the art without departing from the spirit and scope of this invention.

What I claim is:

1. A broad band accoustic transducer comprising, (a) a piezoelectric crystal having conductive plating on two sides;

(b) a first dampening backing layer consisting of tugsten, copper, and indium 50-lead 50 metallurgically bonded to one side of the crystal having an impedance matching the acoustic impedance of the crystal; and (c) a second dampening and attenuation backing layer consisting of tungsten, copper, indium 50-lead 50, and diallyl phthalate metallurigically bonded to the first dampening layer having an impedance matching the acoustic impedance of the first layer and having a very high attenuation factor.

2. A broad band acoustic transducer as recited in claim 1 wherein the attenuation factor of the second dampening and attenuation backing layer is approximately 50 decibels per centimeter.

3. A broad band acoustic transducer as recited in claim 2 wherein the surface interface between the first and second layers is roughened to induce wave scattering preventing back reflections.

4. A broad band acoustic transducer as recited in claim 3 wherein the surface interface between the first and second layers is tilted to induce wave scattering preventing back reflections.

5. A broad band acoustic transducer as recited in claim 4 wherein the surface tilt between the first and second layer is approximately 25 degrees.

6. A broad band acoustic transducer as recited in claim 3 wherein the volume fraction of the first layer is approximately 0.37 tungsten, 0.17 copper, and 0.46 In50-Pb50.

7. A broad band acoustic transducer as recited in claim 4 wherein the volume fraction of the second layer is approximately 0.41 tungsten, 0.12 copper, 0.46 In50-Pb50, and 0.01 diallyl phthalate.

* * * * *